(12) United States Patent
Calaman

(10) Patent No.: US 6,367,544 B1
(45) Date of Patent: Apr. 9, 2002

(54) THERMAL JACKET FOR REDUCING CONDENSATION AND METHOD FOR MAKING SAME

(75) Inventor: Douglas P. Calaman, Landisville, PA (US)

(73) Assignee: Thermal Corp., Georgetown, DE (US)

( * ) Notice: Subject to any disclaimer, the term of this patent is extended or adjusted under 35 U.S.C. 154(b) by 0 days.

(21) Appl. No.: 09/717,409

(22) Filed: Nov. 21, 2000

(51) Int. Cl.[7] ............................................... F28F 13/00
(52) U.S. Cl. .................. 165/135; 165/185; 165/104.33; 165/136; 174/258; 174/16.3; 257/717; 361/700
(58) Field of Search .............................. 165/134.1, 135, 165/136, 80.3, 185, 104.33, 104.34, 80.4; 361/710, 700; 257/706, 717; 174/252, 258, 16.3

(56) References Cited

U.S. PATENT DOCUMENTS

| | | | | |
|---|---|---|---|---|
| 2,905,742 A | * | 9/1959 | Woods ........................ | 165/135 |
| 3,212,864 A | * | 10/1965 | Rhudy ........................ | 165/135 |
| 3,282,011 A | * | 11/1966 | Meserole et al. ............ | 165/135 |
| 3,393,117 A | * | 7/1968 | Zolg et al. .................. | 165/135 |
| 4,830,678 A | | 5/1989 | Todorof ...................... | 136/259 |
| 5,175,613 A | * | 12/1992 | Barker, III et al. .......... | 257/713 |
| 5,180,001 A | * | 1/1993 | Okada et al. ............... | 165/80.4 |
| 5,205,353 A | * | 4/1993 | Willemsen et al. .......... | 165/185 |
| 5,241,131 A | | 8/1993 | Bakhru et al. .............. | 174/15.1 |
| 5,473,118 A | * | 12/1995 | Fukutake et al. ............ | 174/258 |
| 5,666,269 A | | 9/1997 | Romero et al. ............. | 361/699 |
| 5,698,899 A | * | 12/1997 | Hirakawa et al. ........... | 257/712 |
| 5,793,118 A | * | 8/1998 | Nakajima .................... | 257/790 |
| 5,821,612 A | * | 10/1998 | Kitagawa .................... | 257/706 |
| 5,863,185 A | | 1/1999 | Cochimin et al. ......... | 417/44.2 |
| 6,000,912 A | | 12/1999 | Takada et al. ................ | 417/32 |
| 6,108,164 A | | 8/2000 | Weber, Jr. ................. | 360/97.02 |
| 6,154,366 A | * | 11/2000 | Ma et al. .................... | 361/704 |
| 6,292,365 B1 | * | 9/2001 | Ashiwake et al. .......... | 361/700 |

* cited by examiner

Primary Examiner—Ira S. Lazarus
Assistant Examiner—Terrell McKinnon
(74) Attorney, Agent, or Firm—Duane Morris LLP

(57) ABSTRACT

A thermal jacket is provided for reducing the rate of condensation of moisture during subambient operation of a cooled heat sink. The thermal jacket includes a bonding layer positioned in substantially surrounding and overlying relation to the cooled heat sink, at least one porous layer positioned in substantially surrounding and overlying relation to the bonding layer, a barrier layer positioned in substantially surrounding and overlying relation to the at least one porous layer; and a sealant layer positioned in substantially surrounding and overlying relation to the barrier layer. A method of forming the thermal jacket on the surface of the heat sink is also provided.

20 Claims, 5 Drawing Sheets

THERMAL JACKET FOR REDUCING CONDENSATION AND METHOD FOR MAKING SAME

FIELD OF THE INVENTION

The present invention, generally relates to thermal management for electronic devices, and more particularly to apparatus for reducing the occurrence of condensate on thermal management devices.

BACKGROUND OF THE INVENTION

The performance of electronic circuits and their semiconductor devices is limited by temperature. Semiconductor device performance degrades when the internal temperature reaches or exceeds a particular limit. That limit depends upon the nature of the semiconductor device. In order to maintain or increase the performance of such devices, they must be cooled in some way. The manner of cooling depends upon many parameters, including the space available for the cooling process, the temperatures to be encountered, etc. In some instances simply passing a fluid over the device or, over a finned heat sink that is attached to the device, is sufficient to maintain the semiconductor at safe operating temperatures.

In one known semiconductor device cooling technique, convecting fins are attached to a semiconductor package, or the package is affixed to a larger metal member, referred to as a heat sink or cold plate. This heat sink draws heat away from the semiconductor device and can be air cooled or liquid cooled, depending upon the particular application. If the heat sink is air cooled it will typically have heat convecting fins.

Different cooling fluids may be used, when liquid cooled methods are employed, depending upon the application and the density of the electronic devices in a given circuit. Boiling liquids are often used, such as fluorinated hydrocarbon refrigerants, which are delivered to the cold plate in liquid form and are boiled to remove heat. These systems often have the highest heat removal rate for a limited "cold plate" area, but require a considerable amount of power to operate, i.e. to be pumped to and from the heat transfer site.

Under certain circumstances, moisture from the ambient environment may condense on the heat sink or cold plate. In the case of liquid-cooled heat sinks, there are periods of time during which the temperature of the heat sink may fall below the temperature of the surrounding environment, often referred to in the art as "subambient" operation. This condition may occur any time the surface temperature of the heat sink falls below the ambient air temperature. When this subambient operation condition occurs, moisture from the surrounding atmosphere may condense on the outer surface of the heat sink. The condensed moisture collects and runs off of the heat sink and into contact with the circuit board, semiconductors and packages, and other components. This free liquid can cause significant damage to those components and degrade the overall performance of the electronic device, or even destroy it all together.

There is a need for a thermal interface system, positioned between a semiconductor package and its associated heat sink, that will reduce or prevent condensation from forming in appreciable quantities.

SUMMARY OF THE INVENTION

In a preferred embodiment, a thermal jacket is provided that reduces the condensation of moisture during subambient operation of a cooled heat sink by increasing the temperature difference between the surface of the heat sink and the surface of the thermal jacket. The thermal jacket includes a bonding layer positioned in substantially surrounding and overlying relation to the cooled heat sink, at least one porous layer positioned in substantially surrounding and overlying relation to the bonding layer, a barrier layer positioned in substantially surrounding and overlying relation to the at least one porous layer; and a sealant layer positioned in substantially surrounding and overlying relation to the barrier layer. Advantageously, the at least one porous layer traps air close to the surface of the heat sink so as to provide a thermally insulating air barrier between the surface of the heat sink and the ambient environment.

A method for forming a thermal jacket positioned in overlying and substantially surrounding relation to a cooled heat sink is also provided, that reduces the rate of condensation of moisture during subambient operation of the cooled heat sink. The method comprises the steps of applying a bonding layer to the outer surface of the cooled heat sink; applying at least one porous layer to the bonding layer; applying a barrier layer to the porous layer; and applying a sealant layer to the barrier layer.

BRIEF DESCRIPTION OF THE DRAWINGS

These and other features and advantages of the present invention will be more fully disclosed in, or rendered obvious by, the following detailed description of the preferred embodiment of the invention, which is to be considered together with the accompanying drawings wherein like numbers refer to like parts and further wherein.

DETAILED DESCRIPTION OF THE PREFERRED EMBODIMENT

Figure 1:
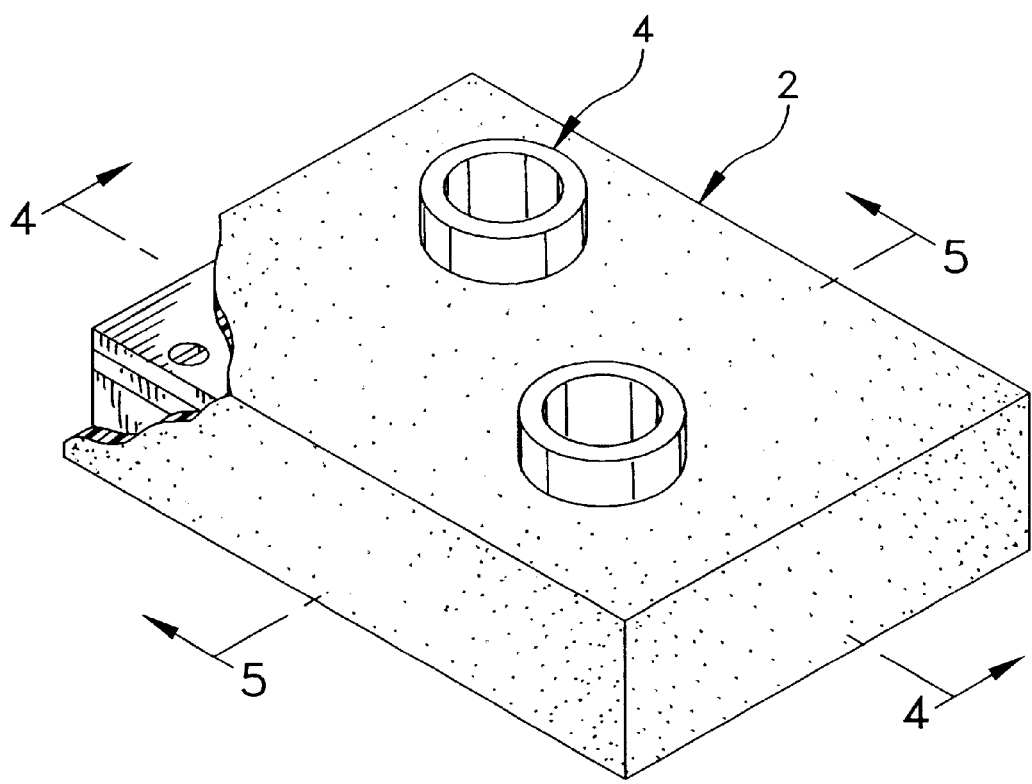
FIG. 1 is a perspective view of a liquid cooled heat sink having a thermal jacket formed on its outer surface in accordance with the present invention, with a portion of the thermal jacket broken away for clarity of illustration.

This description of preferred embodiments is intended to be read in connection with the accompanying drawings, which are to be considered part of the entire written description of this invention. In the description, relative terms such as "horizontal," "vertical," "up," "down," "top" and "bottom" as well as derivatives thereof (e.g., "horizontally," "downwardly," "upwardly," etc.) should be construed to refer to the orientation as then described or as shown in the drawing figure under discussion. These relative terms are for convenience of description and normally are not intended to require a particular orientation. Terms including "inwardly" versus "outwardly," "longitudinal" versus "lateral" and the like are to be interpreted relative to one another or relative to an axis of elongation, or an axis or center of rotation, as appropriate. Terms concerning attachments, coupling and the like, such as "connected" and "interconnected," refer to a relationship wherein structures are secured or attached to one another either directly or indirectly through intervening structures, as well as both movable or rigid attachments or relationships, unless expressly described otherwise. The term "operatively connected" is such an attachment, coupling or connection that allows the pertinent structures to operate as intended by virtue of that relationship.

Figure 2:
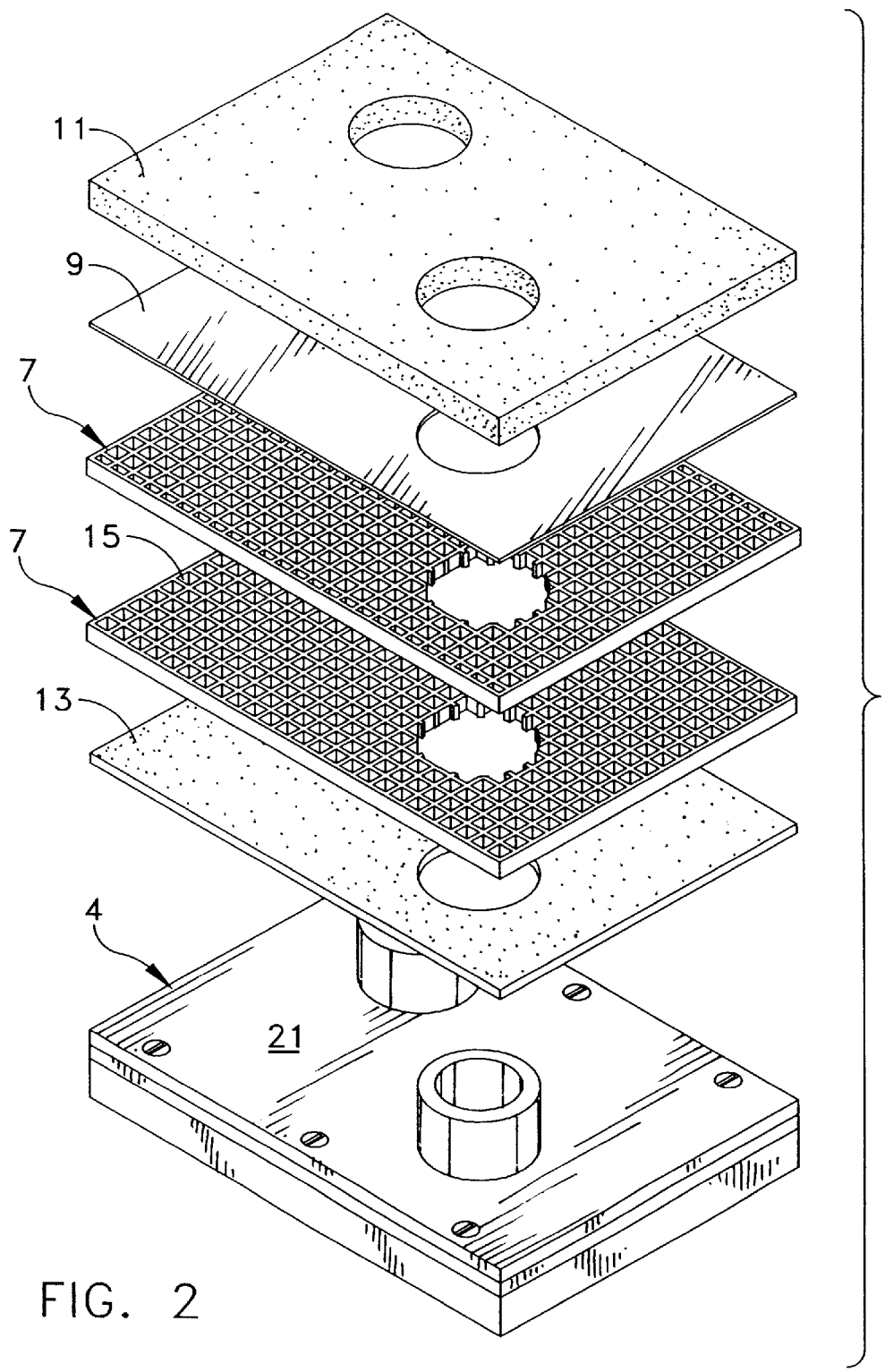
FIG. 2 is a perspective, exploded view of the liquid cooled heat sink shown in FIG. 1, with the various layers of the thermal jacket exploded away from the top surface of the heat sink for clarity and illustration.
Figure 3:
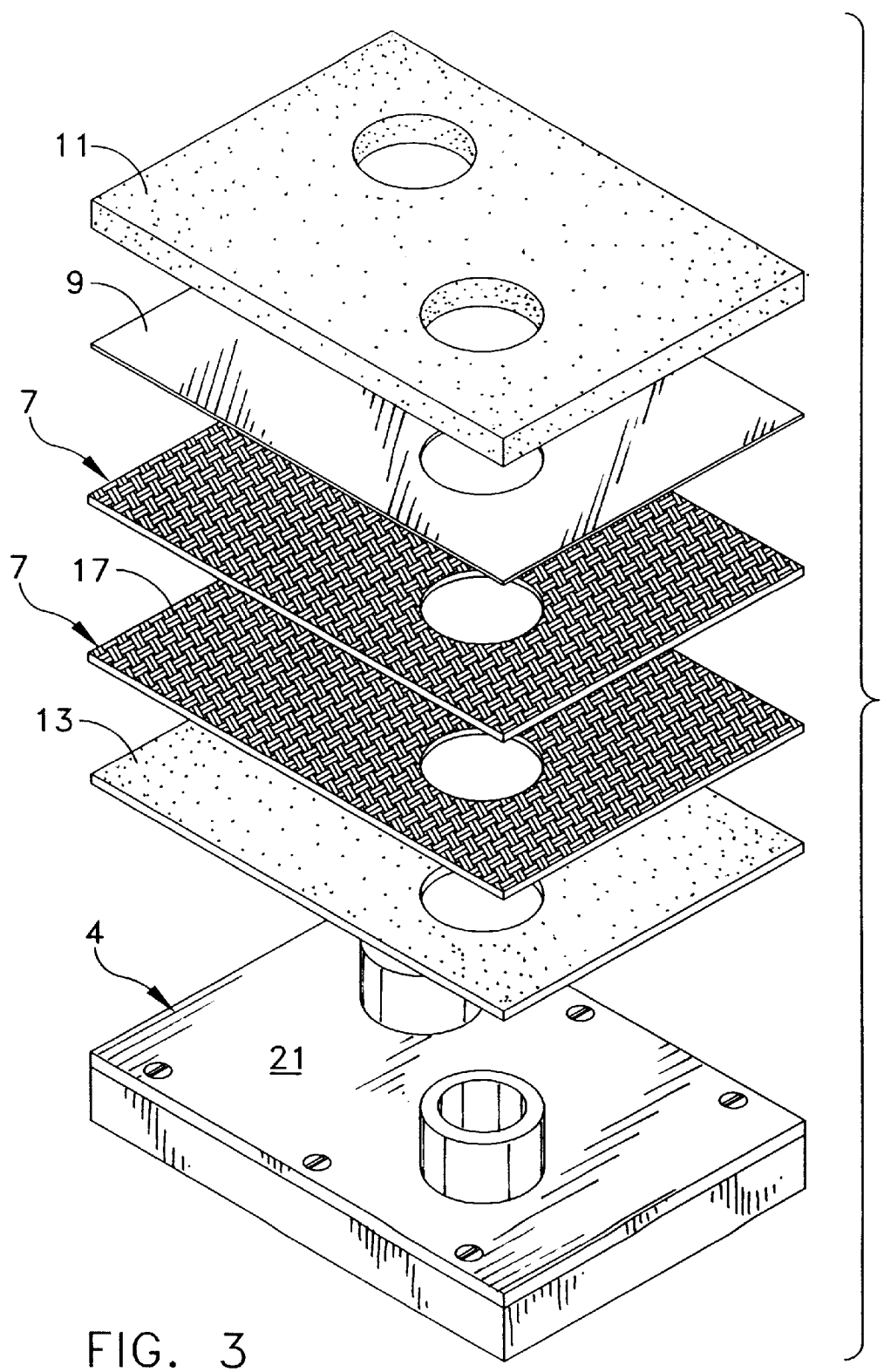
FIG. 3 is a perspective, exploded view similar to that shown in FIG. 2, but illustrating the use of woven material in some layers.
Figure 4:
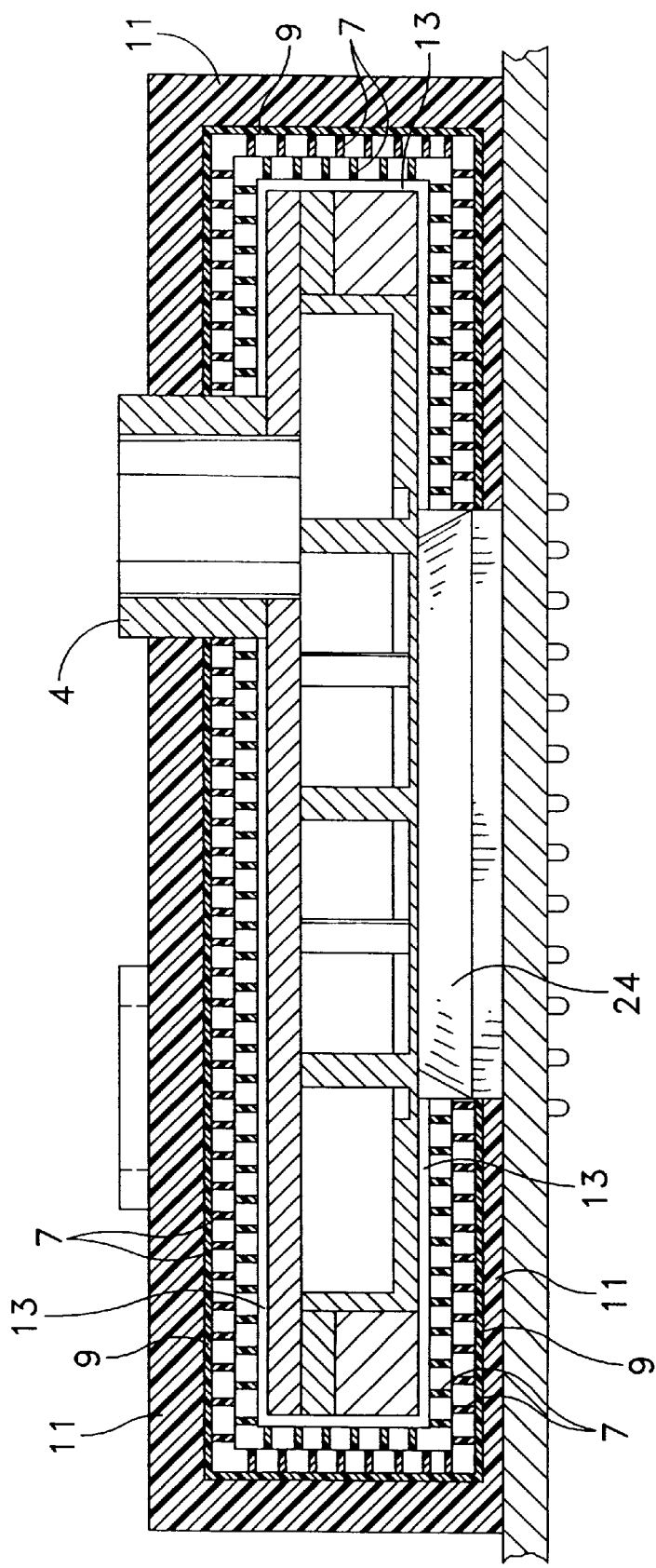
FIG. 4 is a cross-sectional view as taken along line 4—4 in FIG. 1.
Figure 5:
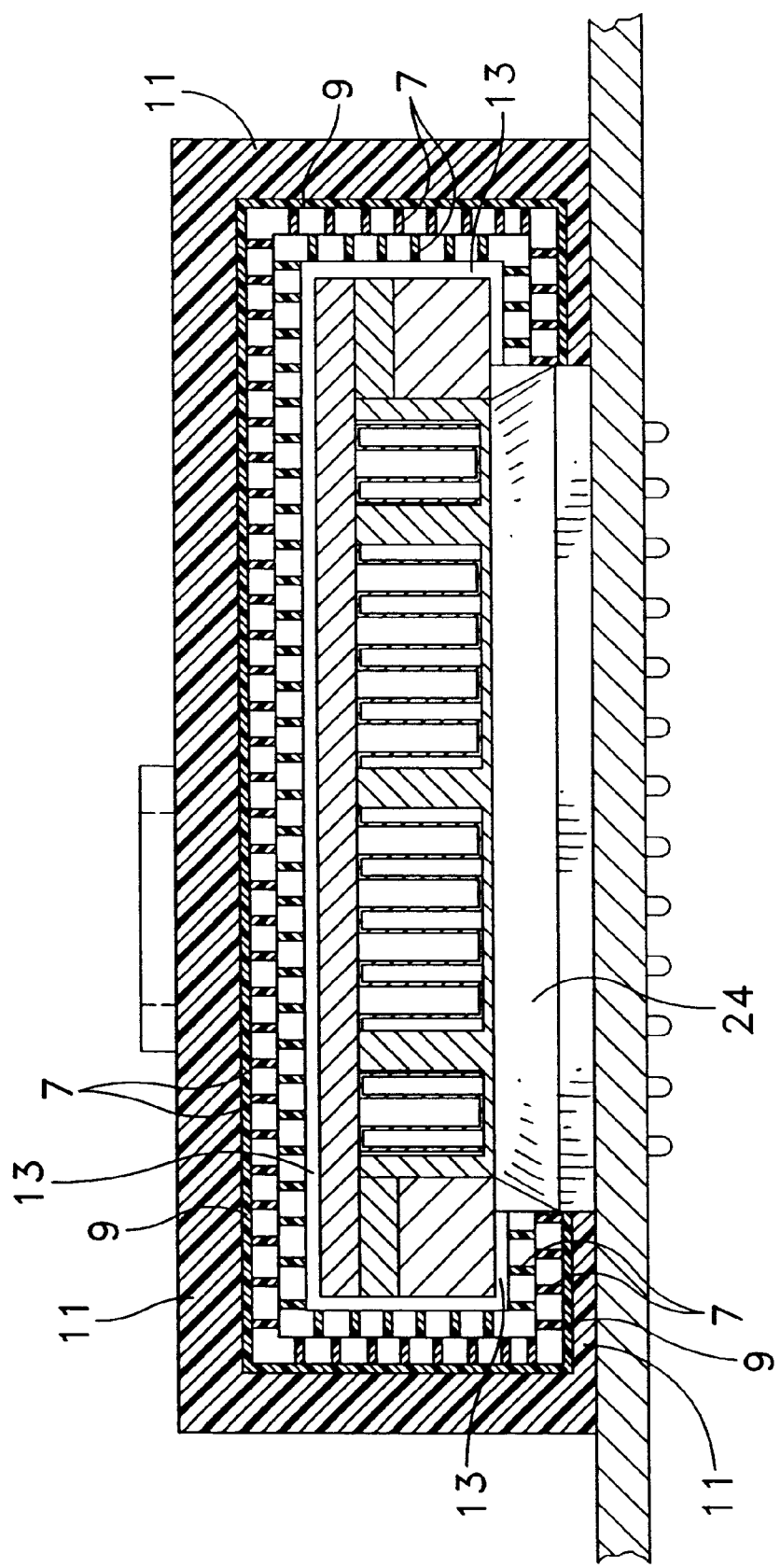
FIG. 5 is a cross-sectional view similar to that of FIG. 4, but taken along line 5—5 in FIG. 1, showing an alternative form of liquid cooled heat sink used in connection with a thermal jacket according to the present invention.

Referring to FIGS. 1–5, a thermal jacket 2 may be positioned over those surfaces of a liquid-cooled heat sink 4 that do not directly engage the semiconductor package, in order to reduce or eliminate condensation that may form during subambient operation. Referring to FIGS. 2 and 3, thermal jacket 2 comprises at least one porous layer 7, a barrier layer 9, a sealant layer 11, and a bonding layer 13. More particularly, porous layer 7 comprises one or more sheets of a mesh or screen, such as a porous membrane having a lattice structure formed by a plurality of openings (identified by reference numeral 15 in FIG. 2), or a fabric-like material of the type having a warp and weft associated with the fibers making up the structure of the fabric (identified by reference numeral 17 in FIG. 3). Porous layer 7 may be formed from a polymer, cloth, or other low thermal conductivity material, and should be sufficiently compliant prior to application to liquid-cooled heat sink 4 so that it can be shaped to conform to surface features. Typically, individual sheets of porous layer 7 will have a thickness in the range from about 0.05 millimeters to about 6 millimeters (mm), and preferably in the range from about 0.5 mm to 3 mm. Multiple sheets of porous layer 7 may be used in connection with the present invention, with one sheet being applied directly over top of a prior sheet, and need not be fastened together. For example, the polypropylene mesh manufactured by the SEFAR America, Inc., under the trade name woven thermoplastic mesh has been used in connection with a multiple layer embodiment of the invention with good results. Advantageously, porous layer 7 traps air close to the surface of heat sink 4, via the openings in the lattice structure or the spaces formed by the warp and weft, so as to provide a thermally insulating air barrier between the surface of heat sink 4 and the ambient environment.

Porous layer 7 is attached to the surface of liquid-cooled heat sink 4 by bonding layer 13. Bonding layer 13 comprises a thermally stable adhesive which may be applied in the form of a conventional "double-sided" tape adhered directly to the outer surface of liquid-cooled heat sink 4 prior to the application of porous layer 7. For example, the double-sided tape manufactured by the Minnesota Mining and Manufacturing Company (3M), under the trade name 966 Hitemperature acrylic has been used with good results. Of course, other thermally stable adhesives may be used to maintain porous layer 7 in place on the surface of liquid-cooled heat sink 4.

A barrier layer 9 is applied to the outer surface of the last sheet of porous layer 7, followed by a sealant layer 11 to complete thermal jacket 2. Barrier layer 9 comprises a relatively thin sheet of low thermal conductivity material such as a relatively thin polymer or cellulose film or the like. For example, a conventional polyethylene film or sheet has been used with good results. Sealant layer 11 is a low thermal constant (i.e., low "k") epoxy of the type well known in the art. For example, the low thermal constant epoxy manufactured by the W.R. Grace & Co., under the trade name Stycast 2850 ST, with 24LV as a catalyst, has been used with good results. As a result of this construction, the openings in the lattice structure 15 or the spaces formed by the warp and weft 17 of porous layer 7 are prevented from being clogged or blocked by sealant layer 11 as a result of barrier layer 9.

Referring to FIGS. 2–5, thermal jacket 2 may be formed on liquid-cooled heat sink 4 in the following manner. The portions of the outer surface 21 of liquid-cooled heat sink 4 that do not act as the direct thermal conduction pathway between the electronics devices or semiconductor package 24 and liquid-cooled heat sink 4 are first covered with bonding layer 13. Once covered with bonding layer 13, at least one sheet of porous layer 7 is applied to bonding layer 13. If multiple sheets of porous layer 7 are used, they may be "tacked" together (i.e., glued or bonded in some manner) at discrete positions and at various locations to hold them in place, since bonding layer 13 may not fully adhere to all sheets of a multiple sheet porous layer 7. Also, each sheet of porous layer 7 may be oriented such that there is a mismatch between the openings of the sheets, from layer to layer, that is formed by the lattice structure 15 or the spaces formed by the warp and weft 17. In this way, trapped air in porous layer 7 acts as an effective insulating barrier. This arrangement enhances the thermal insulating properties of thermal jacket 2. Once porous layer 7 is complete, barrier layer 9 is applied to the outer surface of the mesh followed by an application of sealant 11 to close and complete thermal jacket 2. Advantageously, sealant 11 may be molded to conform to the outer profile of liquid-cooled heat sink 4.

In this way, when liquid-cooled heat sink 4 is at subambient temperatures, thermal jacket 2 forms an insulating barrier between surface 21 and the ambient environment. Thus, the outer surface of thermal jacket 2, i.e., the exposed surface of sealant layer 11, remains at or near to the ambient temperature surrounding the device. As a result, very little, if any, moisture is able to condense on the surface of thermal jacket 2.

It is to be understood that the present invention is by no means limited only to the particular constructions herein disclosed and shown in the drawings, but also comprises any modifications or equivalents within the scope of the claims.

What is claimed is:

1. A thermal jacket positioned in overlying and substantially surrounding relation to a cooled heat sink so as to reduce the rate of condensation of moisture during subambient operation of said heat sink, said thermal jacket comprising:

an adhesive bonding layer positioned in substantially surrounding and overlying relation to a cooled heat sink;

at least two porous layers positioned in substantially surrounding and overlying relation to said bonding layer;

a thin barrier layer positioned in substantially surrounding and overlying relation to said at least two porous layers; and an epoxy sealant layer positioned in substantially surrounding and overlying relation to said barrier layer wherein said epoxy sealant layer is prevented from flowing through said at least two porous layers by said barrier layer.

2. A thermal jacket according to claim 1 wherein said two porous layers comprise a mesh screen with one sheet being applied directly over top of a prior sheet, said two porous layers being oriented such that there is a mismatch between said openings of said sheets from layer to layer so that air is trapped within said porous layer.

3. A thermal jacket according to claim 1 wherein said porous layers includes a fabric having a warp and weft with each sheet being applied directly over top of a prior sheet, said porous layers being oriented such that there is a mismatch between said warp and weft of said sheets from layer to layer so that air is trapped within said porous layer.

4. A thermal jacket according to claim 1 wherein said bonding layer comprises double-sided tape adhered directly to the outer surface of said cooled heat sink.

5. A thermal jacket according to claim 1 wherein said barrier layer comprises a relatively thin sheet of low thermal conductivity polymer film.

6. A thermal jacket positioned in substantially surrounding relation to a cooled heat sink so as to reduce the rate of condensation of moisture during subambient operation of said heat sink, said thermal jacket comprising:
- a bonding layer;
- at least one porous layer positioned in substantially surrounding and overlying relation to said bonding layer;
- a barrier layer positioned in substantially surrounding and overlying relation to said at least one porous layer; and
- a sealant layer positioned in substantially surrounding and overlying relation to said barrier layer wherein said sealant layer is prevented from entering said porous layer by said barrier layer.

7. A thermal jacket according to claim 6 wherein said porous layer comprises at least one sheet of a porous membrane.

8. A thermal jacket according to claim 7 wherein said porous membrane comprises a mesh screen having a lattice structure including a plurality of openings.

9. A thermal jacket according to claim 7 wherein said porous membrane comprises a fabric screen having a warp and weft.

10. A thermal jacket according to claim 7 wherein said porous membrane comprises a mesh screen formed from a polymer having relatively low thermal conductivity.

11. A thermal jacket according to claim 7 wherein said porous membrane comprises a mesh screen that is sufficiently compliant so as to be conformally shaped to said cooled heat sink.

12. A thermal jacket according to claim 7 wherein said porous layer includes multiple sheets of a mesh screen with one sheet being applied directly over top of a prior sheet.

13. A thermal jacket according to claim 6 wherein said bonding layer comprises a thermally stable adhesive.

14. A thermal jacket according to claim 6 wherein said bonding layer comprises double-sided tape adhered directly to the outer surface of said cooled heat sink.

15. A thermal jacket according to claim 6 wherein said barrier layer comprises a relatively thin sheet of low thermal conductivity polymer film.

16. A thermal jacket according to claim 6 wherein said sealant layer is a low thermal constant epoxy.

17. A thermal jacket according to claim 12 wherein said multiple sheets of said mesh screen are tacked together.

18. A thermal jacket according to claim 6 wherein said porous layer includes multiple sheets of a mesh screen with each successive sheet being applied directly over top of a prior sheet, said multiple sheets being oriented such that there is a mismatch between said openings of said sheets from layer to layer so that air is trapped within said porous layer.

19. A thermal jacket according to claim 6 wherein said porous layer includes multiple sheets of a fabric having a warp and weft with each successive sheet being applied directly over top of a prior sheet, said multiple sheets being oriented such that there is a mismatch between said warp and weft of said sheets from layer to layer so that air is trapped within said porous layer.

20. A method for forming a thermal jacket positioned in overlying and substantially surrounding relation to a cooled heat sink so as to reduce the rate of condensation of moisture during subambient operation of said heat sink comprising:
- (A) applying a bonding layer to said cooled heat sink;
- (B) applying at least one porous layer to said bonding layer and entrapping air within said porous layer;
- (C) applying a barrier layer to said porous layer; and
- (D) applying a sealant layer to said barrier layer wherein said sealant layer is prevented from flowing into said porous layer and displacing said entrapped air by said barrier layer.

\* \* \* \* \*